(12) United States Patent
Arendt et al.

(10) Patent No.: US 12,494,567 B2
(45) Date of Patent: Dec. 9, 2025

(54) TELEMATICS DEVICE AND MOTOR VEHICLE

(71) Applicant: Bayerische Motoren Werke Aktiengesellschaft, Munich (DE)

(72) Inventors: Christian Arendt, Munich (DE); Omid Pahlevan Sharif, Bad Homburg (DE); Guenter Rohr, Erdweg (DE); Markus Wudy, Oberschleissheim (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 325 days.

(21) Appl. No.: 17/928,870

(22) PCT Filed: Jun. 22, 2021

(86) PCT No.: PCT/EP2021/066969
§ 371 (c)(1),
(2) Date: Nov. 30, 2022

(87) PCT Pub. No.: WO2021/259920
PCT Pub. Date: Dec. 30, 2021

(65) Prior Publication Data
US 2023/0231304 A1 Jul. 20, 2023

(30) Foreign Application Priority Data
Jun. 24, 2020 (DE) ...................... 10 2020 116 621.4

(51) Int. Cl.
*H05K 1/00* (2006.01)
*H01Q 1/32* (2006.01)
(Continued)

(52) U.S. Cl.
CPC ........... *H01Q 1/3233* (2013.01); *H01Q 21/28* (2013.01); *H05K 1/0243* (2013.01); *H05K 1/141* (2013.01);
(Continued)

(58) Field of Classification Search
CPC .... H01Q 1/3233; H01Q 21/28; H05K 1/0243; H05K 1/141; H05K 1/142; H05K 2201/10098
(Continued)

(56) References Cited

U.S. PATENT DOCUMENTS

| 7,419,381 B2 * | 9/2008 | Jang | H05K 3/366 |
| | | | 439/55 |
| 10,582,644 B1 * | 3/2020 | Hur | H05K 1/181 |

(Continued)

FOREIGN PATENT DOCUMENTS

| CN | 206977407 U | * 2/2018 | ............. G07C 5/008 |
| DE | 202004002332 U1 | 4/2004 | |

(Continued)

OTHER PUBLICATIONS

International Search Report corresponding to International Patent Application No. PCT/EP2021/066969, dated Sep. 28, 2021 (5 pages).

(Continued)

*Primary Examiner* — Zhengfu J Feng
(74) *Attorney, Agent, or Firm* — Maginot, Moore & Beck LLP

(57) ABSTRACT

A telematics device includes a housing, and first and second circuit boards. An electronic control unit of the telematics device is arranged on the first circuit board. At least one antenna of the telematics device is arranged on the second circuit board. The first circuit board and the second circuit board are arranged together in the housing. The first circuit board and the second circuit board are coupled by means of at least one electrical connecting element.

20 Claims, 4 Drawing Sheets

(51) Int. Cl.
  *H01Q 21/28* (2006.01)
  *H05K 1/02* (2006.01)
  *H05K 1/14* (2006.01)
(52) U.S. Cl.
  CPC ... *H05K 1/142* (2013.01); *H05K 2201/10098* (2013.01)
(58) Field of Classification Search
  USPC .................................................. 361/699, 720
  See application file for complete search history.

(56) References Cited

U.S. PATENT DOCUMENTS

| | | | |
|---|---|---|---|
| 2012/0026709 A1 | 2/2012 | Chuang | |
| 2013/0203274 A1* | 8/2013 | Kraft | H05K 1/141 439/74 |
| 2014/0016280 A1* | 1/2014 | Kim | G11C 29/54 174/250 |
| 2018/0277934 A1* | 9/2018 | Kim | H01Q 1/38 |
| 2019/0037689 A1* | 1/2019 | Du | H05K 1/115 |
| 2019/0067163 A1* | 2/2019 | Qi | H01L 23/4334 |
| 2019/0081422 A1* | 3/2019 | Chuang | H05K 1/18 |
| 2020/0013476 A1* | 1/2020 | Konan | G06F 13/4282 |
| 2020/0344869 A1* | 10/2020 | So | H01L 23/552 |

FOREIGN PATENT DOCUMENTS

| | | |
|---|---|---|
| DE | 102005053974 B3 | 3/2007 |
| DE | 102011003377 A1 | 8/2012 |
| DE | 102018111554 A1 | 11/2019 |
| EP | 2128841 A1 | 12/2009 |
| EP | 3557770 A1 | 10/2019 |

OTHER PUBLICATIONS

German Search Report corresponding to German Patent Application No. 10 2020 116 621.4, dated May 20, 2021 (7 pages).

* cited by examiner

TELEMATICS DEVICE AND MOTOR VEHICLE

The present application is the U.S. national phase of PCT Application PCT/EP2021/066969 filed on Jun. 22, 2021, which claims priority of German patent application No. 102020116621.4 filed on Jun. 24, 2020, which is incorporated herein by reference in its entirety.

TECHNICAL FIELD

Exemplary embodiments relate to a telematics device having a housing. Such a telematics device can be used, for example, in motor vehicles in order to enable radio connections of the motor vehicle by means of various radio standards. Accordingly, one exemplary embodiment relates to a motor vehicle having such a telematics device.

BACKGROUND

Modern motor vehicles are equipped with a wide range of networking technologies. These enable the vehicle to be connected to the outside world, e.g. via mobile communications (e.g. 3G, 4G or 5G) or so-called V2X (Vehicle-To-X) radio technologies. Connections between the vehicle and a user or their mobile device can take place, for example, via Bluetooth or Wi-Fi (e.g. local radio standards); positioning of the vehicle can be enabled via satellite-based positioning systems, e.g. GNSS (Global Navigation Satellite Systems). A telematics control unit (abbreviated to TCU) represents a central connectivity gateway. Among other functions, an E-Call (emergency call) functionality (e.g. automatic emergency call function) can be implemented via the TCU.

Telecommunications modules or telematics control units are usually subject to the development cycles of motor vehicles (e.g. four to five years), whereas consumer electronics are subject to shorter development cycles (e.g. one year). Compared to consumer electronics, vehicles may therefore sometimes not provide or support current (i.e. state-of-the-art) communication technologies.

The longer life cycles of vehicles (e.g. up to ten years) also make it difficult to respond to the end of life of communications technologies, which are determined by mobile communications network operators. The end of life of a communications technology requires upgrading of the telecommunications module of an vehicle already in service to allow it also to support new (future) mobility features.

However, replacing the telematics control unit may in some cases be impossible or very costly, due to compatibility issues. For example, changes in the telematics control unit may lead to a new certification being necessary, which should therefore normally be avoided after the component has been successfully certified. Changes to a telematics unit in the vehicle domain can therefore lead to high additional costs. This presents difficulties, particularly with regard to the different development cycles mentioned above when comparing the entertainment industry (e.g. mobile wireless devices) and the automotive industry.

SUMMARY

One object of this disclosure is to provide improved concepts for telematics devices, particularly for use in vehicles.

This object is achieved according to the subject matter of the independent patent claims. Further advantageous embodiments are described in the dependent patent claims, the following description, and in connection with the figures.

Accordingly, a telematics device having a housing is proposed. In particular, the telematics device is designed for use in a vehicle. The telematics device comprises a first circuit board, with an electronic control unit of the telematics device being arranged on the first circuit board. The telematics device also comprises a second circuit board, with at least one antenna of the telematics device being arranged on the second circuit board. The first circuit board and second circuit board are arranged together in the housing and are coupled by means of at least one electrical connecting element. For example, additional separate circuit boards (e.g. a third and/or fourth circuit board) with one or more antennas each can be provided, which are each connected to the first circuit board.

By separating the first circuit board from the second circuit board, a modular design of the telematics device, e.g. a telematics control unit in a vehicle, can be achieved. At the same time, by using the common housing, an overall size of the telematics device can be reduced, for example. The requirements on the first circuit board (e.g. PCB; printed circuit board) with the electronic control unit can differ from those relating to the second circuit board. Due to the modular design, different circuit boards can advantageously be used, for example, which can result in improved function and/or reduced overall costs. For antennas, an effective height (e.g. measured from a metallic base plate of the housing) can be an important aspect, in particular when used in vehicles. For example, the first circuit board can be populated on both sides, and by separating at least the first and second circuit boards, for example, the two boards can be offset in the z-direction (i.e. in the direction of the height of the housing). This means that, for example, even if the first circuit board is populated with components on both sides, an overall height of the housing can depend solely on a height of the antenna (e.g. a vertical extent of the circuit board populated on both sides can be less than a vertical extent of the antenna, wherein both elements can be arranged completely overlapping in the vertical direction). Furthermore, if necessary, a single one of the two circuit boards can be replaced if, for example, requirements on the radio standards change. In other words, it is not necessary to replace the entire telematics unit in this event. For example, it is possible to replace only the first circuit board containing the electronic control unit and to retain the second circuit board with the at least one antenna, thus avoiding the need for redevelopment and/or re-certification and/or validation of the second circuit board.

A motor vehicle fitted with a corresponding telematics device is also proposed. One advantage can be that the telematics device can be flexibly modified, e.g. updated, without the need for further (e.g. geometry-related) changes in the motor vehicle (e.g. adaptation of the installation space for the telematics device). This makes it easier, for example, to adapt a long-lasting vehicle to current, more short-lived radio standards, so that a motor vehicle can be connected to current radio communication devices using the modular telematics device.

BRIEF DESCRIPTION OF THE FIGURES

Exemplary embodiments will be explained below with reference to the accompanying drawings. In the drawings:

FIG. 4b shows a side view of the modular telematics control unit of FIG. 4a;

DESCRIPTION

Figure 1:
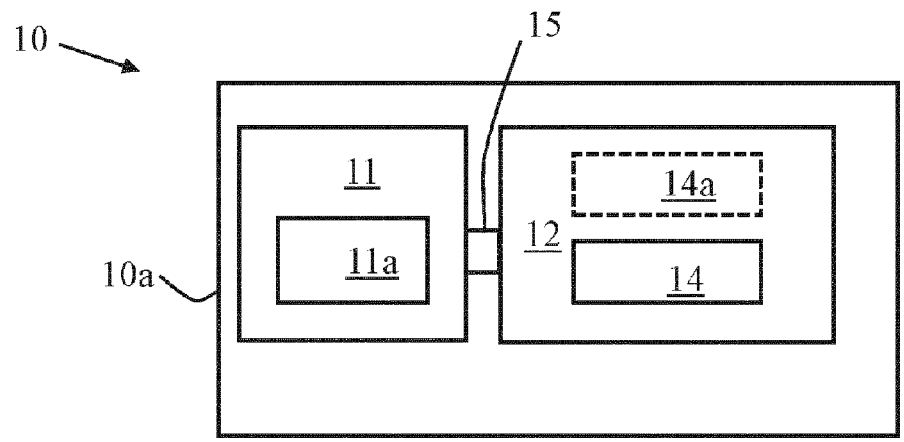
FIG. 1 shows a schematic example of a telematics device.

Various exemplary embodiments will now be described in more detail with reference to the accompanying drawings, in which several exemplary embodiments are shown. In the figures, the thickness dimensions of lines, layers and/or regions are shown exaggerated for the sake of clarity. In the following description of the attached figures, which only show some exemplary embodiments, the same reference numerals can be used to designate identical or equivalent components.

Any element which is designated as being "connected" or "coupled" to any other element can either be directly connected or coupled to the other element or else intervening elements may be present. Unless otherwise defined, all of the terms used herein (including technical and scientific terms) have the same meanings as would be ascribed to them by an average person skilled in the art in the field to which the exemplary embodiments belong.

Vehicle connectivity-architecture concepts are designed, for example, in such a way that the antenna and telematics control unit (TCU) are designed as two separate components (e.g. in separate housings). These can be connected directly to each other (e.g. roof antenna and roof TCU) or via coaxial cables. The former variant can reduce the signal attenuation caused by the coaxial cables, in order to increase signal reception and/or signal transmission performance. For example, it is possible to integrate mobile radio, GNSS and SDARS antennas into the space of the telematics control unit (e.g. in a single module), e.g. to reduce electrical losses that would be introduced into the system by plug-in connections and to reduce the size of the geometric package of the system assembly (e.g. the installation space) and the effort involved in installing the system. Modules designed in this way are, for example, fixed to the body of the vehicle or directly to the roof shell.

Such concepts sometimes have a major influence on the design of the integration space (e.g. installation space) in the vehicle. As this is usually selected in the roof region of the vehicle for antenna systems and telematics devices and the module must not be covered by electrically shielding components such as sheet metal or CF laminate, in order to avoid strong shielding of the signal power, corresponding glass or plastic surfaces must considered in the exterior design of the vehicle. This means, for example, that telematics modules with integrated antenna components should be taken into account in the vehicle planning from the outset. The integration of these concepts into pre-existing vehicle designs can lead, for example, to increased development effort and thus greater costs.

The following text describes concepts that can be flexibly adapted, for example, by means of a modular design of the telematics control unit. It is possible to change only individual components as required, but to continue using others so that the entire device does not have to be re-developed to update the telematics control unit.

FIG. 1 shows a schematic representation of a telematics device 10 comprising a housing 10a. The telematics device 10 also comprises a first circuit board 11, with a control unit 11a of the telematics device 10 being arranged on the first circuit board 11. The telematics device 10 also comprises a second circuit board 12, with at least one antenna 14 of the telematics device 10 being arranged on the second circuit board 12. It is also provided that the first circuit board 11 and second circuit board 12 are arranged together in the housing 10a and are coupled by means of at least one electrical connecting element 15 (e.g. circuit-board connector).

The telematics device 10 can form a telematics control unit with an integrated antenna for a motor vehicle. Advantageously, the modular design with separate circuit boards 11, 12 (e.g. PCBs; printed circuit boards) can ensure greater flexibility in the use of more up-to-date components. For example, only one of the two circuit boards needs to be replaced, provided the other circuit board is still up-to-date.

For example, the first circuit board 11 may have a higher number of layers than the second circuit board 12. Layers in circuit boards describe the electrically conductive layers in circuit boards that are stacked on top of one another. So-called multi-layer circuit boards can require less space, for example, and/or provide improved functioning of the circuit board. However, circuit boards with more layers are more expensive. The separated design can allow only as many layers to be used as actually required for the respective circuit board. For example, the second circuit board 12 with the antenna 14 may require fewer layers than the first circuit board 11 with the electronic control unit 11a.

For example, an underside of the first circuit board will be arranged offset upwards relative to the underside of the second circuit board. The first circuit board can be populated with electronic components on its top and underside. For example, the antenna of the second circuit board may have a greater height than the first circuit board, and the first circuit board may be centered relative to an antenna vertical extension. In this way, the installation space in the housing 10a can be better used, for example. By installing the first circuit board offset in height, the total size of the housing 10a and thus the telematics device 10 can be reduced, for example. For example, the two-sided component mounting can also allow better heat dissipation from the first circuit board (e.g. by means of a metallic base plate of the telematics device 10).

For example, at least two antennas 14, 14a are arranged on the second circuit board 12. In particular, a plurality of antennas can be mounted on the second circuit board 12. In this case the at least two antennas are each arranged at different corner regions of the second circuit board. Such an arrangement can be advantageous for the function of the radio characteristics (e.g. for improved simultaneous use of the antennas).

For example, the at least two antennas 14, 14a of the second circuit board 12 are designed for operation in at least two different radio standards. For example, the telematics device 10 is designed for operation in at least one radio standard from a mobile radio standard, a local radio network standard, or a satellite-based radio standard. Thus, the first antenna 14 can be a mobile radio antenna (e.g. LTE antenna) and the second antenna 14a can be an antenna for a satellite-based navigation system (e.g. GNSS antenna or HP (high-precision) GNSS antenna for implementing a High Precision (HP) GNSS radio standard). In general, radio standards such as the 3GPP mobile communications standard (such as 2G, 3G, 4G, or 5G), standards for a wireless local area network (WLAN; for example, according to the IEEE 802.11 standard of the Institute of Electrical and Electronics Engineers, IEEE), short-range data transmission standards (such as IEEE 802.15, also known as Bluetooth), and/or near-field communication (NFC) standards. In addition, radio standards such as SDARS (Satellite Digital Audio Radio Services) for satellite radio and/or C2X/V2X (car-to-X/vehicle-to-X) and/or DSRC (Dedicated Short Range Communication) for direct car-to-car or car-to-infrastructure communication may be provided.

Figure 2:
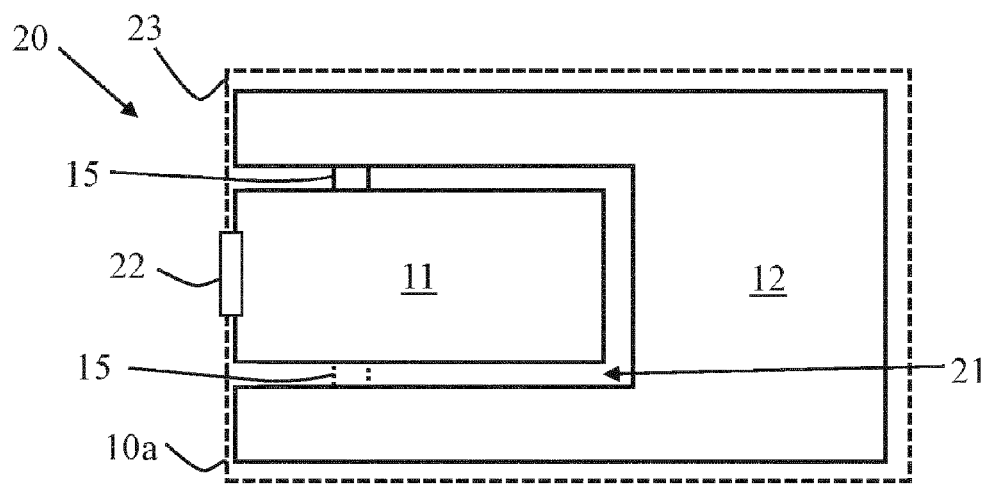
FIG. 2 shows a schematic example of a telematics device with a cutout in a circuit board of the telematics device.

FIG. 2 shows a schematic example of a telematics device 20 with a cutout 21 in the circuit board 12 of the telematics device 20. It is provided that the first circuit board is arranged at least partly within the cutout of the second circuit board (in the example of FIG. 2, completely inside the cutout 21). The arrangement of the first circuit board 11 in the cutout 21 can enable particularly good use to be made of the available installation space. For example, the second circuit board is rectangular and the cutout is centered on one side of the rectangle. In this way, e.g. at the corner regions of the second circuit board 12, antennas can also be arranged at the side of the cutout 21, wherein the free central region can be used efficiently for the arrangement of the first circuit board 11. Such an arrangement of the antennas (e.g. mobile radio antennas) can lead to an improved function of the telematics device 20, as an improved decorrelation of the antennas and/or a greater distance between the antennas can be achieved.

For example, the second circuit board 12 can have at least one additional cutout. In the additional cutout, for example, a further (e.g. third) circuit board can be arranged. Alternatively or in addition, a battery can be arranged in the additional cutout, for example, which can enable an autonomous functioning of the telematics device 20 even when disconnected from the on-board power supply of the vehicle. In this way, for example, an emergency call function may also be possible even if the telematics device 10 is disconnected from the on-board power supply of the vehicle.

For example, multiple mobile radio antennas may be deployed to enable parallel usage for higher data rates or redundant usage for better reception. The first circuit board 11 can be provided with a single electrical connection 15 (e.g. connector; e.g. board-to-board (B2B) connector), however a plurality of electrical connecting elements can also be used, e.g. to reduce cable losses. FIG. 2 shows the possibility of additionally using a second connecting element 15, e.g. in order to implement corresponding cable path lengths between the respective antennas of the second circuit board 12 and the electronic control unit 11a of the first circuit board 11. The first and second circuit boards 11, 12 can therefore be coupled by means of two or more separate electrical connecting elements 15, 15a.

For example, the first circuit board 11 of the telematics device 20 can have at least one connector (e.g. connection element) arranged on an outer side 23 of the first circuit board 11, the at least one connector 22 forming an external connection of the telematics device 20. It is advantageous to provide a plurality of different connectors on the outer side 23. This allows the telematics device 20 to be connected to a motor vehicle, e.g. a cable harness of the motor vehicle. It is advantageous if the telematics device 20 has external connectors only on one outer side 23, so that the telematics device 20 can be installed very easily.

Further details and aspects are mentioned in conjunction with the examples described above or below. The exemplary embodiment shown in FIG. 2 may have one or more optional additional features corresponding to one or more aspects mentioned in connection with the proposed design or with one or more exemplary embodiments described above (e.g. FIG. 1) or below (e.g. FIGS. 3-6).

Figure 3:
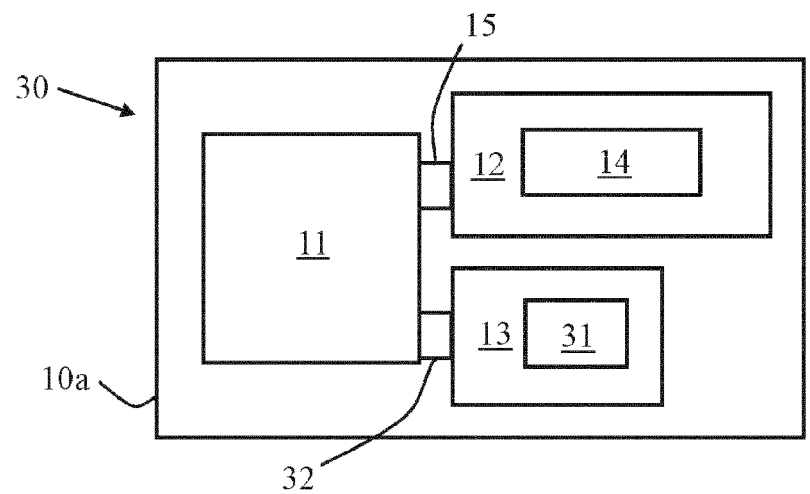
FIG. 3 shows a schematic example of a telematics device with two separate antenna circuit boards.

FIG. 3 shows a schematic example of a telematics device 30 with two separate antenna circuit boards. Accordingly, the telematics device 30 has a third circuit board 13, on which at least one antenna 31 of the telematics device 30 is arranged. The antenna 31 can support the same mobile communication standard as the antenna 14 and/or antenna 14a of the second circuit board 12. Alternatively, however, the antennas of the different antenna circuit boards can be designed for different applications. For example, the antenna 14 of the second circuit board 12 can be designed to operate in a mobile communications standard and the antenna 31 of the third circuit board 13 can be designed to operate in a satellite-based radio standard. In other words, for example, a mobile radio antenna and a GNSS antenna of the telematics device 30 can be arranged on different circuit boards, e.g. antenna PCBs. To further increase modularity, it may be possible also to provide additional separate antenna circuit boards so that, for example, each antenna of the telematics device 30 can be arranged on its own separate circuit board. The third circuit board 13 is coupled to the control unit by means of a connecting element 32 corresponding to the necessary connection to the first circuit board 11.

Further details and aspects are mentioned in conjunction with the exemplary embodiments described above or below. The exemplary embodiment shown in FIG. 3 can have one or more optional additional features corresponding to one or more aspects mentioned in connection with the proposed design or with one or more exemplary embodiments described above (e.g. FIGS. 1-2) or below (e.g. FIGS. 4a-6).

Figure 4A:
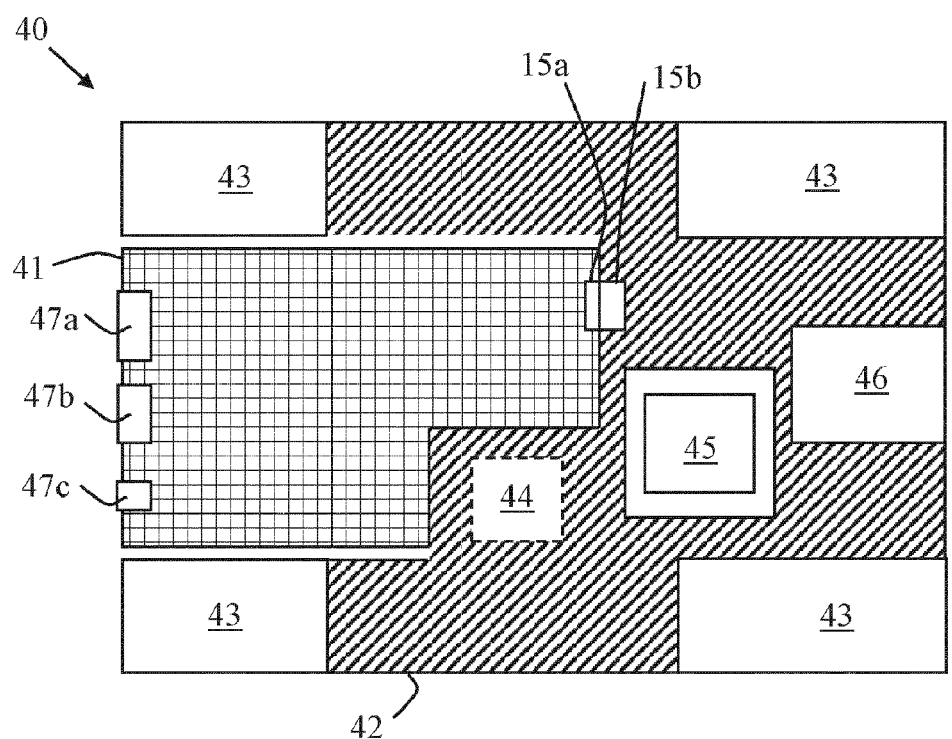
FIG. 4a shows a plan view of an exemplary modular telematics control unit.
Figure 4B:
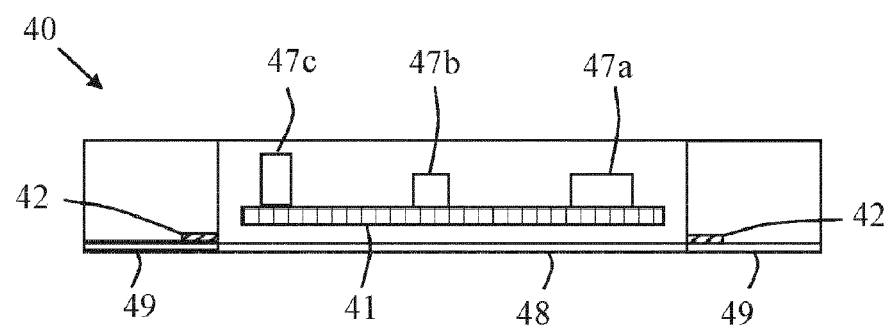

FIGS. 4a and 4b show an example of a telematics control unit 40 (e.g. telematics device) in a plan view and a side view. The telematics control unit 40 has a first circuit board 41, which is arranged in a recess of a second circuit board 42. The first circuit board can comprise a control electronics and can therefore be designated as an ECU (electronic control unit) board or an ECU-PCB (printed circuit board). The antennas 43, 44, 45 are arranged on the second circuit board 42, and so the second circuit board 42 can be designated as an antenna circuit board or antenna PCB. The external antennas 43 can be mobile radio antennas, the additional antennas 44, 45 can be antennas for satellite-based navigation systems, e.g. a GNSS antenna and/or optionally a SDARS antenna (e.g. antenna 44). An additional set of electronics 46 (e.g. semiconductor device) can also be arranged on the antenna circuit board 42. The first circuit board 41 has a connecting element 15a and the second circuit board 42 has a connecting element 15b to enable a signal connection between the circuit boards (e.g. board-to-board connector). On the outer side of the first circuit board 41 (e.g. an outer side of the telematics control unit 40), external connections 47a are arranged (e.g. MQS (Micro Quadlock System) or Nano-MQS), 47b (e.g. bus system connection; e.g. LIN bus; e.g. CAN bus; e.g. Ethernet), 47c (e.g. coaxial connectors, designed e.g. in accordance with the FAKRA (automotive specialist working group) standard) (e.g. plug-and-socket connections).

In the embodiment according to FIG. 4a, a modular design is implemented which provides a separation of the Electronic Control Unit (ECU)-PCB from the PCB with the antenna components. The two PCBs are connected to an interface, preferably a board-to-board (B2B) connector. The positioning of the B2B connector as well as the antenna components is chosen, for example, such that the connecting conductors, preferably microstrip conductors, are routed across the PCB material, e.g. FR4, via the shortest path possible in order to reduce the attenuation losses, in particular at high frequencies (communication in high frequency bands). An example structure (plan view) for the described exemplary embodiment is shown in FIG. 4a.

For example, the ECU-PCB is fitted with connectors for connection to the on-board power supply and a vehicle bus. An additional connection for external antennas (mobile radio, V2X, etc.) or feeding through the SDARS signal (e.g. for applications in USA) to a tuner control unit (e.g. a 4-way FAKRA) can complete the external connections. In other words, the telematics control unit 40 can be designed so that, for example, additional external antennas (i.e. outside the housing of the telematics control unit 40) can be connected to the control unit. Since the control unit PCB is located, e.g. on one side, e.g. the short side of the control unit housing (e.g. outer side 23), all external connectors protrude, for example, from one side of the TCU housing (e.g. telematics device, e.g. telematics control unit).

The modular structure of the TCU (e.g. with regard to the separation of the circuit boards; at least separation into ECU- and antenna-PCB) enables, for example, the ECU-PCB to be used in multiple TCU variants (by means of different component mounting variants). A B2B connector can be used to ensure the direct connection to the antenna PCB. In one exemplary embodiment, the antenna PCB 41 contains at least one, preferably four mobile radio antennas 43 (e.g. MIM01, MIM02, MIM03, MIM04) as well as a GNSS antenna 45, preferably a stacked GNSS antenna for the reception of multiple GNSS frequency bands (e.g. L1/L2/L5/RTK). Optionally, a SDARS antenna 44 can be provided. In addition, the design of the antenna PCB 42 provides, for example, a cutout (e.g. in addition to the cutout for the ECU-PCB) for inserting a backup battery (e.g. E-Call without on-board power supply connection) in the overall housing.

FIG. 4b also shows the side view of the telematics control unit 40. The first circuit board 11 with the ECU components (e.g. populated on one side or, alternatively, on both sides) can be inserted into the control unit housing (e.g. housing 10a) (screw connection, slide-in unit, etc.). For example, the telematics control unit 40 can have a metallic base plate 48. Depending on the design, a metallic base plate 49 can also be arranged below the antennas 43 (e.g. mobile radio antennas). For example, a single metallic base plate can be provided as the base of the telematics control unit 40.

Preferably, the antenna PCB 42 (e.g. second circuit board 12) and the ECU-PCB 41 (e.g. first circuit board 11) are spatially offset in the z-direction (e.g. in the direction of the height of the housing, as can be seen in FIG. 4b), to be able to allocate as much height as possible for the antenna function and still enable components to be mounted on both sides of the ECU-PCB 41. The antenna PCB 42 can either fill the entire area of the TCU housing or, if advantageous for the antenna function, only a part of it. Cutouts in the antenna PCB 42 at suitable positions (see also FIG. 4b) can be used on the one hand to reduce weight and costs, and on the other hand, the height saved can be beneficial for the antenna function. The antenna function can also be tuned/improved with suitably placed recesses in the metallic underside of the TCU housing. In addition, the antenna circuit board 42 can be implemented with fewer layers than the ECU-PCB 41. This can lead to cost savings, for example.

Further details and aspects are mentioned in conjunction with the examples described above or below. The exemplary embodiment shown in FIGS. 4a, 4b can have one or more optional additional features corresponding to one or more aspects mentioned in connection with the proposed design or with one or more exemplary embodiments described above (e.g. FIGS. 1-3) or below (e.g. FIGS. 5-6).

Figure 5:
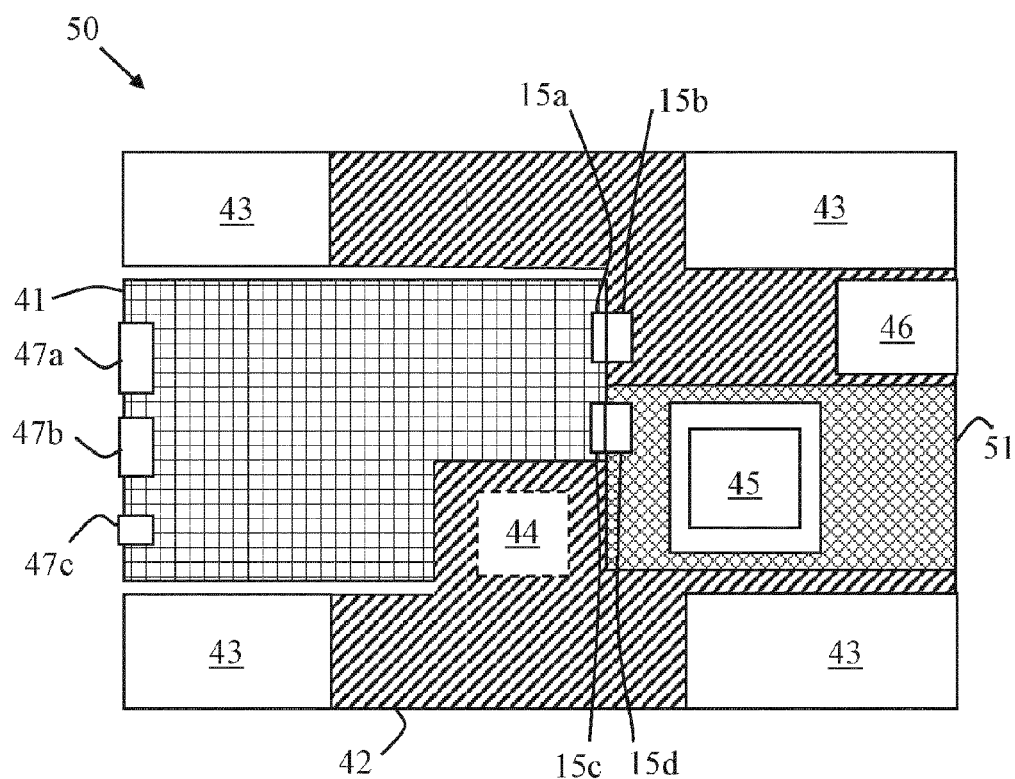
FIG. 5 shows an example of a modular telematics control unit with a first antenna circuit board for mobile communication antennas and a second antenna circuit board for an antenna of a satellite navigation system.

FIG. 5 shows an exemplary embodiment of a telematics control unit 50 with three separate circuit boards 41, 42, 51. As in the example in FIGS. 4a, b, the second circuit board 42 is intended for the arrangement of multiple mobile radio antennas 43, while the antenna 45 for a satellite-based navigation system is arranged on the separate third circuit board 51. This further increases the modularity of the telematics control unit 50. For example, the second circuit board 42 or its antenna technology can be changed without needing to change the antenna 45. In accordance with the requirements on the signal connection between the first circuit board 41 and third circuit board 51, additional connecting elements 15c, 15d are provided, which enable a corresponding circuit board connection.

In the exemplary embodiment shown, the antennas for satellite services (GNSS, e.g. SDARS for operation in the USA) are located on an additional, separate PCB, so that the housing 10a of the telematics module (e.g. telematics device 10) comprises a total of three PCBs within a modular architecture (ECU-PCB, e.g. the first circuit board 11, 41; mobile radio/WIFI/V2X antennas PCB, e.g. the second circuit board 12, 42; GNSS and/or SDARS antennas PCB, e.g. the third circuit board 13, 51).

Further details and aspects are mentioned in conjunction with the examples described above or below. The exemplary embodiment shown in FIG. 5 can have one or more optional additional features corresponding to one or more aspects mentioned in connection with the proposed design or with one or more exemplary embodiments described above (e.g. FIGS. 1-4b) or below (e.g. FIG. 6).

Figure 6:
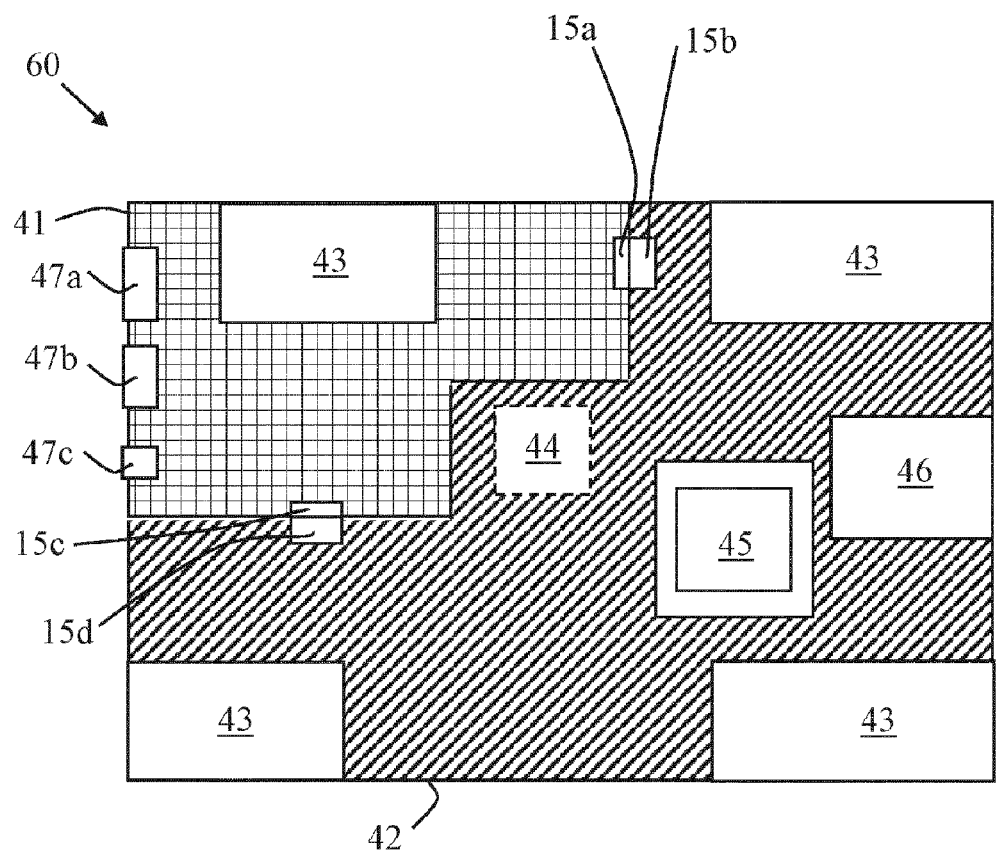
FIG. 6 shows an example of a telematics device with antennas mounted on both the antenna circuit board and on the ECU circuit board.

FIG. 6 shows an example of another telematics device 60, with the first circuit board 41 positioned in a free corner region of the second circuit board 42. In contrast to FIG. 4a or FIG. 5, for example, one of the four antennas 43 is arranged on the ECU circuit board 41 together with the electronic control unit (not shown) instead of on the antenna circuit board 42. As an alternative to the illustration shown, it may be possible to reposition the connectors of the external connections 47a, 47b, 47c so that the antenna 43 can be arranged in the outer corner region (top left, e.g. corner region of the housing) of the ECU circuit board, for example to achieve better antenna function.

The antenna (e.g. mobile radio antenna) 43, which is arranged on the ECU-PCB 41, can be used to send an emergency call, for example, if an E-Call function is required. In normal operation (e.g. if an E-Call function is not required), the antenna 43 of the ECU-PCB 41 can be used as a fourth antenna for the multi-antenna system (e.g. operation as in the examples shown in FIG. 4a and FIG. 5 is also possible). For example, an advantage of the telematics device 60 shown may be that the antenna 43 arranged on the ECU circuit board 41 can also be used in cases where the connecting elements 15a, 15b, 15c, 15d do not allow connection of the two circuit boards (e.g. disconnected connecting elements; e.g. defect).

Further details and aspects are mentioned in conjunction with the exemplary embodiments described above or below. The exemplary embodiment shown in FIG. 6 can have one or more optional additional features corresponding to one or more aspects mentioned in connection with the proposed design or with one or more exemplary embodiments described above (e.g. FIGS. 1-5) or below.

In a further exemplary embodiment, the GNSS patch/GNSS patches can be implemented in conjunction with a positioning receiver on a separate PCB (separate from the antenna PCB and ECU-PCB). The modular separation can be further developed in accordance with further exemplary embodiments, e.g. each individual antenna component can be connected to the ECU-PCB on a separate circuit board. A modular design of the control electronics (e.g. control unit 11a) on the ECU-PCB (e.g. first circuit board 11) can also be advantageous.

The examples shown above relate to the modularity of a telematics control unit with respect to the antenna and control unit circuit boards. In other words, a modular TCU (telematics control unit) architecture is proposed.

The designs presented enable, for example, the use of an ECU-PCB variant (for example, the first circuit board 11) for different TCU variants in varying types of housing. The designs presented can enable compatibility of the same type of ECU-PCB (e.g. with different configuration variants) with internal antennas integrated in the TCU housing, a directly contacted (roof) antenna, and/or with external (distributed) antenna components. One and the same (e.g. fully developed and certified) ECU-PCB can therefore be used, for example, for newly developed as well as for existing vehicles. This can reduce certification and development costs, for example.

The use of the same PCB can achieve, for example, correspondingly higher unit quantities with corresponding cost savings. For example, the same software can be reused. The modularity can, for example, reduce certification to individual (e.g. newly developed) sub-components that are to be replaced. For example, it allows the upgrade to later technology standards in individual modules without requiring the re-certification of all existing components. The modularity enables, for example, better use of space in the control unit (TCU), since individual elements can be accommodated on multiple levels. Since the height of the TCU is geared, for example, to the size of the connectors (e.g. output connectors), there is usually a good deal of empty space in the housing when using an individual PCB (printed circuit board), which remains unused.

Multiple PCBs can advantageously be designed to satisfy the requirements. For example, the larger antenna PCB can be designed with two layers, whereas the ECU-PCB might require six or more layers. The more expensive PCB with more layers therefore does not need to be used for all components, which can reduce costs.

According to examples, for example, certification-relevant components, relevant components for functional safety and/or components that must remain unchanged over a longer period of time and also in different overall systems (e.g. vehicle projects), or require a longer development time than "rigid generic parts", can be separated from the remaining components. The rigid components include, for example, the emergency call components, as well as the V2X (vehicle-to-vehicle communication, infrastructure and/or other subscriber) components, components for high-precision positioning (e.g. GNSS), and components for functional safety. The high-precision positioning and the associated components for functional safety are used, for example, in autonomous driving. For example, dependencies between different certification classes can be avoided. Parts or components that have to be adapted to the overall system (e.g. vehicle) or that have a shorter and more agile development cycle thus gain in flexibility and simplify and facilitate variant formation as well as the updating capability and further development. In general terms, the separation of such rigid generic components of the system (e.g. the telematic device 10) from the agile system-bound components can, for example, gain flexibility, reduce costs, allow reuse of individual components, and/or shorten or simplify the development cycle.

The invention claimed is:

1. A telematics device comprising:
a housing;
a first circuit board, an electronic control unit of the telematics device arranged on the first circuit board; and
a second circuit board, at least one antenna of the telematics device arranged on the second circuit board,
wherein the first circuit board and the second circuit board are arranged together in the housing and are coupled by means of at least one electrical connecting element;
wherein the second circuit board has a cutout and the first circuit board is arranged at least partially within the cutout of the second circuit board;
wherein at least two antennas are arranged on the second circuit board;
wherein each of the at least two antennas arranged at a different corner region of the second circuit board; and
wherein the cutout is disposed between a first corner region on which is arranged a first antenna and a second corner region on which is arranged a second antenna.

2. The telematics device as claimed in claim 1, wherein the first circuit board comprises a multi-layer circuit board with a higher number of layers than the second circuit board.

3. The telematics device as claimed in claim 2, wherein:
an underside of the first circuit board is offset upwards relative to an underside of the second circuit board; and
the first circuit board is populated with electronic components on an upper side of the first circuit board and the underside of the first circuit board.

4. The telematics device as claimed in claim 1, wherein:
an underside of the first circuit board is offset upwards relative to an underside of the second circuit board; and
the first circuit board is populated with electronic components on an upper side of the first circuit board and the underside of the first circuit board.

5. The telematics device as claimed in claim 1, wherein:
the first circuit board has at least one connector arranged on an outer side of the first circuit board; and
the at least one connector forms an external connection of the telematics device.

6. The telematics device as claimed in claim 1, wherein the first circuit board and the second circuit board are coupled by means of at least two separate electrical connecting elements.

7. The telematics device as claimed in claim 1, wherein the at least two antennas are designed for operation in at least two different radio standards.

8. The telematics device as claimed in claim 1, wherein the telematics device is configured for operation in at least one radio standard selected from a mobile communications standard, a local radio network standard, and a satellite-based radio standard.

9. The telematics device as claimed in claim 1, wherein the second circuit board has at least one additional cutout, and wherein at least one of a third circuit board or a battery of the telematics device is arranged in the additional cutout.

10. The telematics device as claimed in claim 1, further comprising a third circuit board having at least one additional antenna of the telematics device arranged thereon.

11. The telematics device as claimed in claim 10, wherein:
the at least one antenna of the second circuit board is configured to operate in a mobile communications standard; and
the at least one additional antenna of the third circuit board is configured to operate in a satellite-based positioning system.

12. The telematics device as claimed in claim 1, wherein the control unit on the first circuit board has a modular design using a plurality of separate semiconductor components.

13. A motor vehicle comprising a telematics device as claimed in claim 1.

14. The telematics device as claimed in claim 1, wherein the electronic control unit of the telematics device is an electronic control unit of a vehicle telematics device that is operably coupled to a vehicle bus.

15. A telematics device comprising:
a housing;
a first circuit board, an electronic control unit of the telematics device arranged on the first circuit board; and
a second circuit board, at least one antenna of the telematics device arranged on the second circuit board,
wherein the first circuit board and the second circuit board are arranged together in the housing and are coupled by means of at least one electrical connecting element; and
wherein the first circuit board is configured to be modularly replaceable by insertion into the housing.

16. The telematics device as claimed in claim 15, wherein the second circuit board has a cutout and the first circuit board is arranged at least partially within the cutout of the second circuit board.

17. The telematics device as claimed in claim 16, wherein at least two antennas are arranged on the second circuit board.

18. The telematics device as claimed in claim 17, wherein each of the at least two antennas is arranged at a different corner region of the second circuit board, and
wherein the cutout is disposed between a first corner region on which is arranged a first antenna and a second corner region on which is arranged a second antenna.

19. The telematics device as claimed in claim 15, wherein at least two antennas are arranged on the second circuit board.

20. The telematics device as claimed in claim 19, wherein each of the at least two antennas is arranged at a different corner region of the second circuit board.

* * * * *